(12) United States Patent
Kim et al.

(10) Patent No.: US 9,991,389 B2
(45) Date of Patent: Jun. 5, 2018

(54) THIN FILM TRANSISTOR, A THIN FILM TRANSISTOR ARRAY PANEL INCLUDING THE SAME, AND A METHOD OF MANUFACTURING THE SAME

(71) Applicant: SAMSUNG DISPLAY CO., LTD., Yongin-si, Gyeonggi-Do (KR)

(72) Inventors: Sung Ho Kim, Suwon-si (KR); Min Chul Shin, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days. days.

(21) Appl. No.: 15/469,750

(22) Filed: Mar. 27, 2017

(65) Prior Publication Data
US 2018/0013008 A1 Jan. 11, 2018

(30) Foreign Application Priority Data
Jul. 5, 2016 (KR) .................. 10-2016-0084909

(51) Int. Cl.
*H01L 29/786* (2006.01)
*H01L 27/12* (2006.01)
*H01L 29/66* (2006.01)

(52) U.S. Cl.
CPC ...... *H01L 29/78618* (2013.01); *H01L 27/124* (2013.01); *H01L 27/1225* (2013.01); *H01L 27/1296* (2013.01); *H01L 29/66969* (2013.01); *H01L 29/7869* (2013.01); *H01L 29/78696* (2013.01)

(58) Field of Classification Search
CPC ...... H01L 29/7869–29/78693; H01L 27/3274; H01L 27/1225; H01L 27/124; H01L 27/1296; H01L 29/78696; H01L 29/66969; H01L 29/1041–29/105; H01L 29/66568–29/66659
See application file for complete search history.

(56) References Cited

U.S. PATENT DOCUMENTS

| 6,262,436 | B1 | 7/2001 | Nakata | |
| 2009/0065771 | A1* | 3/2009 | Iwasaki | H01L 29/78618 257/43 |
| 2010/0159639 | A1* | 6/2010 | Sakata | H01L 21/02565 438/104 |

FOREIGN PATENT DOCUMENTS

| JP | 2012-033836 | 2/2012 |
| KR | 10-0375885 | 2/2003 |
| KR | 10-2012-0109368 | 10/2012 |

* cited by examiner

*Primary Examiner* — Tucker J Wright
(74) *Attorney, Agent, or Firm* — F. Chau & Associates, LLC

(57) ABSTRACT

A thin film transistor includes a semiconductor layer, a gate electrode, and an insulating layer. The semiconductor layer includes a source electrode, a drain electrode, and a channel part disposed therebetween. The gate electrode is disposed on the channel part and extends in a direction crossing a channel length direction of the semiconductor layer. The insulating layer includes a second region connected to the first region and extending in a same direction as an extending direction of the gate electrode from the first region. A hydrogen content of the source electrode or the drain electrode is in a range between a maximum hydrogen content that is larger than a hydrogen content of the second region of the insulating layer by about 10% and a minimum hydrogen content that is smaller than the hydrogen content of the second region of the insulating layer by about 10%.

21 Claims, 7 Drawing Sheets

THIN FILM TRANSISTOR, A THIN FILM TRANSISTOR ARRAY PANEL INCLUDING THE SAME, AND A METHOD OF MANUFACTURING THE SAME

CROSS-REFERENCE TO RELATED APPLICATION

This application claims priority under 35 U.S.C. § 119 to Korean Patent Application No. 10-2016-0084909 filed in the Korean Intellectual Property Office on Jul. 5, 2016, the entire contents of which are incorporated by reference herein.

TECHNICAL FIELD

Exemplary embodiments of the present invention relate to a thin film transistor, and more particularly to a thin film transistor. array panel including the same, and a method of manufacturing the same.

DISCUSSION OF RELATED ART

A thin film transistor (TFT) is used in various electronic devices such as a flat panel display. For example, a thin film transistor may be used as a switching element or a driving element in a flat panel display. The flat panel display may be a liquid crystal display (LCD), an organic light-emitting diode (OLED) display, or an electrophoretic display.

A thin film transistor may include a gate electrode, a source electrode, a drain electrode, and a semiconductor. The gate electrode may be connected to a gate line transmitting a scanning signal. The source electrode may be connected to a data line transmitting a signal applied to a pixel electrode. The drain electrode may face the source electrode. The semiconductor may be electrically connected to each of the source electrode and the drain electrode.

The semiconductor may determine characteristics of the thin film transistor. The semiconductor may include silicon (Si). The silicon may be divided into amorphous silicon and polysilicon according to a crystallization type. The amorphous silicon may have a relatively simple manufacturing process. However, the amorphous silicon has a relatively low charge mobility such that there is a limit in manufacturing a high performance thin film transistor. The polysilicon has a relatively high charge mobility. However, a process of crystallizing the silicon is required. Thus, a manufacturing cost thereof is increased and the process is relatively complex.

Research into a thin film transistor using an oxide semiconductor having a relatively higher electron mobility than the amorphous silicon, a relatively high ON/OFF ratio, a relatively lower cost than the polysilicon, and a relatively high uniformity has been performed.

SUMMARY

One or more exemplary embodiments of the present invention provide a thin film transistor. The thin film transistor includes a semiconductor layer, and insulating layer, and a gate electrode. The semiconductor layer includes a source electrode, a drain electrode, and a channel part. The channel part is disposed between the source electrode and the drain electrode. The gate electrode is disposed on the channel part. The gate electrode extends in a direction crossing a channel length direction of the semiconductor layer. The insulating layer includes a first region disposed between the gate electrode and the channel part. The insulating layer includes a second region connected to the first region and extending in a same direction as an extending direction of the gate electrode from the first region. A hydrogen content of the source electrode or the drain electrode is in a range between a maximum hydrogen content that is larger than a hydrogen content of the second region of the insulating layer by about 10%, and a minimum hydrogen content that is smaller than the hydrogen content of the second region of the insulating layer by about 10%.

The hydrogen content of each of the source electrode and the drain electrode may be larger than the hydrogen content of the channel part. The hydrogen content of each of the source electrode and the drain electrode may be smaller than the hydrogen content of the second region of the insulating layer.

The hydrogen content of the second region of the insulating layer may be larger than a hydrogen content of the first region of the insulating layer. The hydrogen content of the second region of the insulating layer may be smaller than the hydrogen content of the source electrode or the drain electrode.

An extending length of the insulating layer and the gate electrode may be smaller than an extending length of the semiconductor layer.

A first end of the gate electrode may be in contact with the first region of the insulating layer. A gate line may be connected to a second end of the gate electrode.

The channel part may enclose the source electrode or the drain electrode.

The channel part may have a circular shape or a quadrangular shape.

One or more exemplary embodiments of the present invention provide a thin film transistor array panel. The thin film transistor array panel includes an insulation substrate, a semiconductor layer, a gate electrode, and an insulating layer. The semiconductor layer is disposed on the insulation substrate. The semiconductor layer includes a source electrode, a drain electrode, and a channel part. The channel part is disposed between the source electrode and the drain electrode. The gate electrode is disposed on the channel part. The gate electrode extends in a direction crossing a channel length direction of the semiconductor layer. The insulating layer includes a first region disposed between the gate electrode and the channel part. The insulating layer includes a second region connected to the first region and extending in a same direction as an extending direction of the gate electrode from the first region. A hydrogen content deviation of the source electrode or the drain electrode and the second region of the insulating layer is less than about 10%.

The hydrogen content of each of the source electrode and the drain electrode may be larger than a hydrogen content of the channel part. The hydrogen content of each of the source electrode and the drain electrode may be smaller than the hydrogen content of the second region of the insulating layer.

The hydrogen content of the second region of the insulating layer may be larger than a hydrogen content of the first region of the insulating layer. The hydrogen content of the second region of the insulating layer may be smaller than the hydrogen content of each of the source electrode or the drain electrode.

An extending length of the insulating layer and the gate electrode may be smaller than an extending length of the semiconductor layer.

A first end of the gate electrode may be in contact with the first region of the insulating layer. A gate line may be connected to a second end of the gate electrode.

The channel part may enclose the source electrode or the drain electrode. A buffer layer may be disposed between the insulation substrate and the semiconductor layer.

One or more exemplary embodiments of the present invention provide a method of manufacturing a thin film transistor array panel. The method includes forming a semiconductor pattern including an oxide semiconductor material. An insulating layer is formed on a channel part of the semiconductor pattern. A gate electrode is formed on the insulating layer. A source electrode and a drain electrode are formed on opposite sides of the channel part in the semiconductor pattern. The insulating layer includes a first region disposed between the gate electrode and the channel part. The insulating layer includes a second region connected to the first region and extending in a same direction as an extending direction of the gate electrode from the first region. The gate electrode extends in a direction crossing a channel length direction of the semiconductor pattern. A hydrogen content of the source electrode or the drain electrode is in a range between a maximum hydrogen content that is larger than a hydrogen content of the second region of the insulating layer by about 10% and a minimum hydrogen content that is smaller than the hydrogen content of the second region of the insulating layer by about 10%.

Forming the insulating layer may include adjusting at least one among a deposition time, a deposition temperature, or a deposition application power of the insulating layer so that the hydrogen content of the source electrode or the drain electrode is in the range between the maximum hydrogen content and the minimum hydrogen content.

The method may further include forming a passivation layer covering each of the semiconductor pattern, the insulating layer, and the gate electrode. In forming the gate electrode on the insulating layer, an extending length of the gate electrode may be formed to be smaller than the extending length of the semiconductor pattern. One end of the gate electrode may be in contact with the first region of the insulating layer in a shape facing the channel part. The method may further include forming a gate line connected to the other end of the gate electrode.

In forming the gate electrode on the insulating layer, the gate electrode may be formed of a shape corresponding to the channel part on the channel part enclosing the source electrode or the drain electrode.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Figure 1:
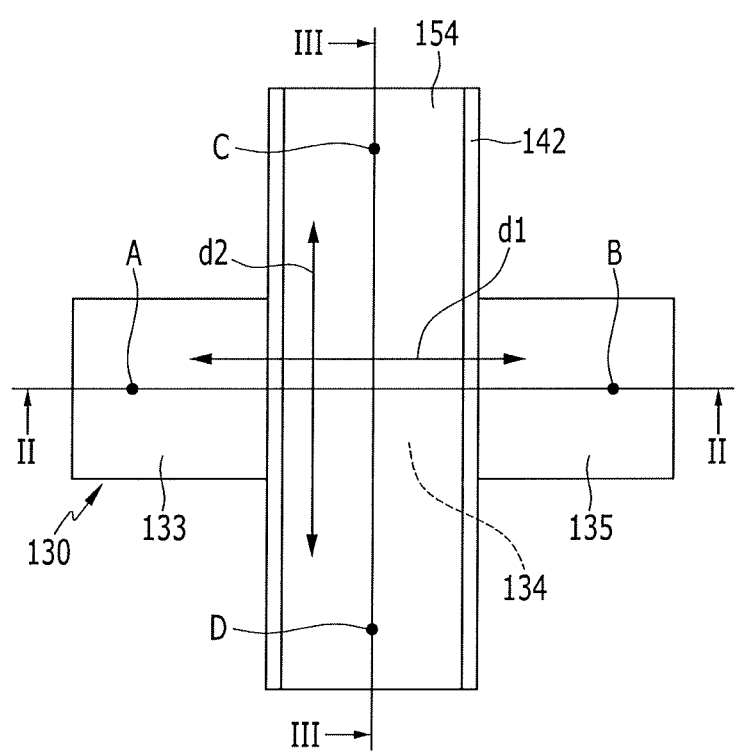
FIG. 1 is a top plan view illustrating a thin film transistor array panel including a thin film transistor according to an exemplary embodiment of the present invention.

One or more exemplary embodiments of present invention will be described more fully hereinafter with reference to the accompanying drawings, in which exemplary embodiments of the invention are illustrated. As those skilled in the art would realize, the described exemplary embodiments may be modified in various different ways, all without departing from the spirit or scope of the present invention.

In order to clarify exemplary embodiments of the present invention, parts that are not connected with the description may be omitted. The same elements or equivalents may be referred to by the same reference numerals throughout.

The size and thickness of each element illustrated in the drawings are illustrated for better understanding and ease of description and exemplary embodiments of the present invention are not limited thereto. In the drawings, the thickness of layers, films, panels, regions, etc., may be exaggerated for clarity.

Further, in the specification, the phrase "in a plan view" means when an object portion is viewed from above. The phrase "in a cross-section" means when a cross-section taken by vertically cutting an object portion is viewed from the side.

A thin film transistor according to an exemplary embodiment of the present invention, a thin film transistor array panel including the same, and a method of manufacturing the same will be described with reference to accompanying drawings.

Figure 2:
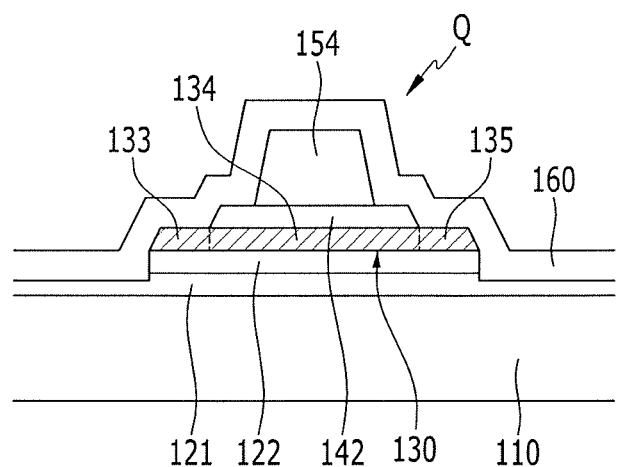
FIG. 2 is a cross-sectional view taken along a line II-II of FIG. 1 according to an exemplary embodiment of the present invention.
Figure 3:
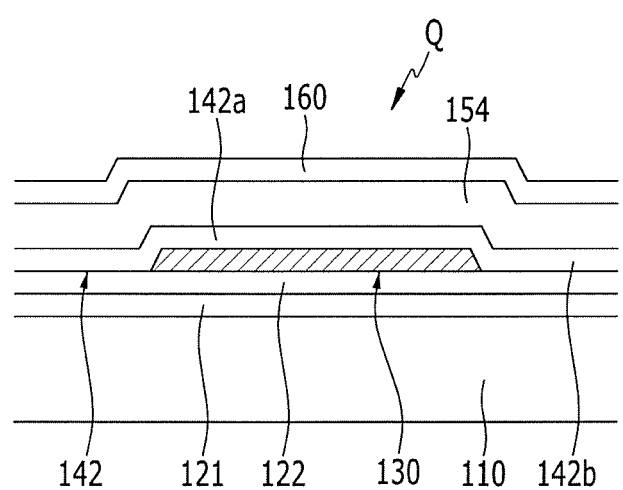
FIG. 3 is a cross-sectional view taken along a line III-III of FIG. 1 according to an exemplary embodiment of the present invention.

FIG. 1 is a top plan view illustrating a thin film transistor array panel including a thin film transistor according to an exemplary embodiment of the present invention. FIG. 2 is a cross-sectional view taken along a line II-II of FIG. 1 according to an exemplary embodiment of the present invention. FIG. 3 is a cross-sectional view taken along a line III-III of FIG. 1 according to an exemplary embodiment of the present invention.

Referring to FIG. 1 to FIG. 3, a buffer layer 121 and 122 may be disposed on an insulation substrate 110. The insulation substrate 110 may include glass or plastic.

The buffer layer 121 and 122 may include an insulating material, for example, silicon oxide ($SiO_x$), aluminum oxide ($Al_2O_3$), hafnium oxide ($HfO_3$), yttrium oxide ($Y_2O_3$), or silicon nitride ($SiN_x$). The buffer layer 121 and 122 may decrease or prevent an inflow of impurities from the insulation substrate 110 to a semiconductor. to be laminated thereafter. Thus, the buffer layer 121 and 122 may protect the semiconductor. The buffer layer 121 and 122 may also increase interface characteristics of the semiconductor. A thickness of the buffer layer 121 and 122 may be about 500 Å to about 10,000 Å; however, exemplary embodiments of the present invention are not limited thereto.

The buffer layer 121 and 122 may include a first buffer layer 121. The buffer layer 121 and 122 may also include a second buffer layer 122. The second buffer layer 122 may be disposed on the first buffer layer 121. The first buffer layer 121 may include silicon nitride ($SiN_x$). The second buffer layer 122 may include silicon oxide ($SiO_x$).

A semiconductor layer 130 may be disposed on the second buffer layer 122.

The semiconductor layer 130 may include an oxide semiconductor material. The oxide semiconductor material may be a metal oxide semiconductor. The metal oxide semiconductor may include an oxide of zinc (Zn), indium (In), gallium (Ga), tin (Sn), and titanium (Ti). Alternatively, the metal oxide semiconductor may include a combination of zinc (Zn), indium (In), gallium (Ga), tin (Sn), titanium (Ti), or an oxide thereof. For example, the oxide semiconductor material may include zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), or any combination thereof.

The semiconductor layer 130 may include a channel part 134, a source electrode 133, and a drain electrode 135. The channel part 134 may be disposed between the source electrode 133 and the drain electrode 135.

The source electrode 133 and the drain electrode 135 may each include substantially the same material as a semiconductor material having conductivity and forming the semiconductor layer 130. The semiconductor material may be, for example, a reduced semiconductor material.

An insulating layer 142 may be disposed on the channel part 134 of the semiconductor layer 130. The insulating layer 142 may cover the channel part 134. The insulating layer 142 might not substantially overlap the source electrode 133 or the drain electrode 135.

The insulating layer 142 may have a single layered structure. Alternatively, the insulating layer 142 may have a multi-layered structure.

When the insulating layer 142 has a single layered structure, the insulating layer 142 may include the insulating oxide. The insulating oxide may include silicon oxide ($SiO_x$), aluminum oxide ($Al_2O_3$), hafnium oxide ($HfO_3$), or yttrium oxide ($Y_2O_3$). The insulating layer 142 may increase the interface characteristic of the channel part 134. The insulating layer 142 may reduce or prevent impurities from penetrating into the channel part 134.

When the insulating layer 142 has a multi-layered structure, a lower layer may include the insulating oxide. The insulating oxide may include a silicon oxide ($SiO_x$), aluminum oxide ($Al_2O_3$), hafnium oxide ($HfO_3$), or yttrium oxide ($Y_2O_3$). Thus, the interface characteristic of the channel part 134 may be relatively increased. Additionally, impurities may be reduced or prevented from penetrating into the channel part 134. An upper layer may be disposed on the lower layer. The upper layer may include various insulating materials such as silicon nitride ($SiN_x$) or silicon oxide ($SiO_x$). For example, the insulating layer 142 may include a lower layer including aluminum oxide ($AlO_x$) and an upper layer including silicon oxide ($SiO_x$). The thickness of the lower layer may be about 500 Å or less. The thickness of the upper layer may be about 500 Å to about 1500 Å. However, exemplary embodiments of the present invention are not limited thereto.

The insulating layer 142 may include the lower layer including silicon oxide ($SiO_x$) and the upper layer including silicon nitride ($SiN_x$). The thickness of the lower layer may be about 2,000 Å. The thickness of the upper layer may be about 1,000 Å. However, exemplary embodiments of the present invention are not limited thereto.

The thickness of the insulating layer 142 may be about 1000 Å to about 5,000 Å; however, exemplary embodiments of the present invention are not limited thereto. The entire thickness of the insulating layer 142 may be variously changed in order to increase the characteristics of the thin film transistor.

A gate electrode 154 may be disposed on the insulating layer 142. An edge boundary of the gate electrode 154 may be positioned inside an edge boundary of the insulating layer 142.

The gate electrode 154 may include a metal such as aluminum (Al), silver (Ag), copper (Cu), molybdenum (Mo), chromium (Cr), tantalum (Ta), titanium (Ti), or an alloy thereof. The gate electrode 154 may have a single layered structure. Alternatively, the gate electrode 154 may have a multi-layered structure. As an example of the multi-layered structure, there may be a dual layer of a lower layer, an upper layer, and a third layer. The lower layer may include titanium (Ti), tantalum (Ta), molybdenum (Mo), or ITO. The upper layer may include copper (Cu). The third layer may include molybdenum (Mo)-aluminum (Al)-molybdenum (Mo). However, the gate electrode 154 may be made of various metals or conductors and is not limited thereto.

The gate electrode 154, the source electrode 133, and the drain electrode 135 may form a thin film transistor (TFT) Q along with the semiconductor 134. A channel of the thin film transistor may be formed in the channel part 134 of the semiconductor layer 130.

The gate electrode 154 may extend and may be formed in a second direction d2. The second direction d2 may cross a first direction d1. The first direction d1 may be a direction crossing an extending direction of the semiconductor layer 130, for example, a channel length direction of the semiconductor layer 130.

The insulating layer 142 disposed below the gate electrode 154 may extend and may be formed in the second direction similar to the gate electrode 154.

The insulating layer 142 may include a first region 142a and a second region 142b. The first region may be disposed on the channel part 134. The second region 142b may extend in substantially the same direction as the extending direction of the gate electrode 154, for example, the second direction d2, from the first region 142a.

If a deviation between the hydrogen content of the second region 142b of the insulating layer 142 and the hydrogen content of the source electrode 133 or the drain electrode 135 increases, hydrogen ion diffusion from the source electrode 133 and/or the drain electrode 135 to the channel part 134 may be non-uniformly generated in a heat treatment process performed in following processes discussed in detail below. Since the hydrogen ions affect a carrier concentration inside the oxide semiconductor, when the hydrogen ion diffusion is non-uniform, characteristics of the semiconductor characteristic may deteriorate.

Accordingly, as the thin film transistor Q minimizes the deviation between the hydrogen content of the insulating layer 142 and the hydrogen content of the source electrode or the drain electrode 135, a deterioration of the semiconductor characteristics that may be generated by the non-uniform diffusion of the hydrogen ions may be reduced or eliminated.

According to an exemplary embodiment of the present invention, the insulating layer 142 may have the shape extending along with the gate electrode 154. However, the insulating layer 142 may be configured as an island-like insulating layer.

The hydrogen content configuration of the semiconductor layer 130 and the insulating layer 142 will be described in more detail below.

Figure 4:
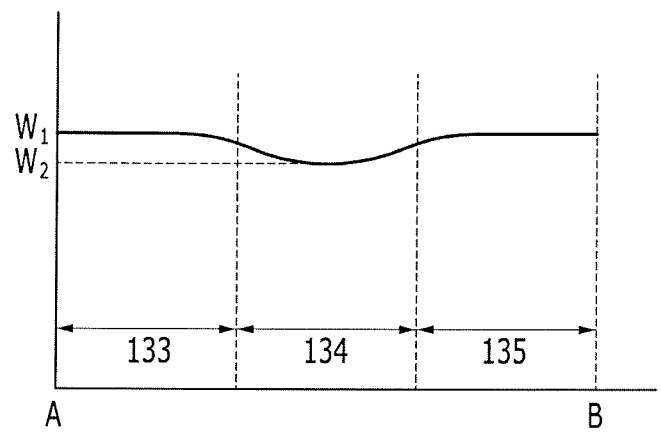
FIG. 4 is a hydrogen content distribution table of a section A-B of FIG. 1 according to an exemplary embodiment of the present invention.
Figure 5:
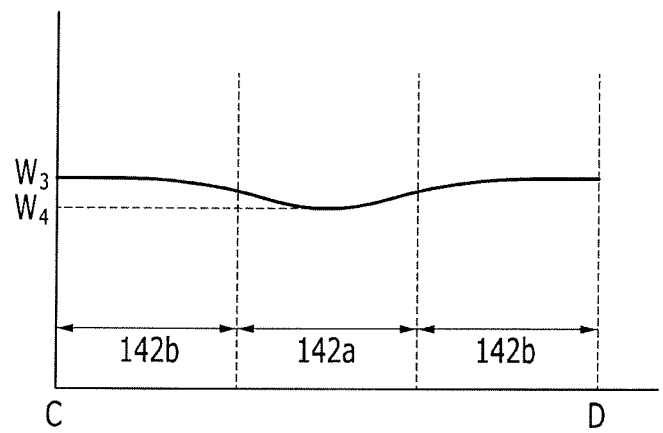
FIG. 5 is a hydrogen content distribution table of a section C-D of FIG. 1 according to an exemplary embodiment of the present invention.

FIG. 4 is a hydrogen content distribution table of a section A-B of FIG. 1 according to an exemplary embodiment of the present invention. FIG. 5 is a hydrogen content distribution table of a section C-D of FIG. 1 according to an exemplary embodiment of the present invention.

FIG. 4 and FIG. 5 illustrate the hydrogen content distribution of each of the semiconductor layer 130 and the insulating layer 142 of the thin film transistor Q according to an exemplary embodiment of the present invention.

Referring to FIG. 4, the hydrogen content in each of the source electrode 133 and the drain electrode 135 of the semiconductor layer 130 may be a first hydrogen content W1. The hydrogen content of the channel part 134 may be a second hydrogen content W2. The second hydrogen content W2 may be gradually decreased from the first hydrogen content W1 at a position where the channel part 134 is connected to each of the source electrode 133 and the drain electrode 135. The second hydrogen content W2 may be lowest at a center of the channel part 134.

The hydrogen content may be a mass percentage reference concentration.

Referring to FIG. 5, the insulating layer 142 may include a pair of second regions 142b. The pair of second regions 142 may be disposed with a first region 142a disposed between them. The hydrogen content of the second region 142b may be a third hydrogen content W3. The hydrogen content of the first region 142a may be a fourth hydrogen content W4. The fourth hydrogen content W4 may gradually decrease from the third hydrogen content W3. The fourth hydrogen content W4 may be lowest at the center of the first region 142a.

The deviation between the first hydrogen content W1 as the hydrogen content of each of the source electrode 133 and the drain electrode 135 and the third hydrogen content W3 as the hydrogen content of the second region 142b is about 10% or less.

When the hydrogen content value is larger by about 10% than the hydrogen content of the second region 142b may be referred to as a maximum hydrogen content. The hydrogen content value that is smaller than the hydrogen content of the second region 142b by about 10% may be referred to as a minimum hydrogen content. The hydrogen content between the source electrode 133 and the drain electrode 135 may be in a range between the maximum hydrogen content and the minimum hydrogen content. The hydrogen content of each of the source electrode 133 and the drain electrode 135 may be substantially equal to the hydrogen content of the second region 142b. The hydrogen content of each of the source electrode 133 and the drain electrode 135 may be substantially equal to or less than the hydrogen content of the second region 142b in a range of less than about 10%.

Accordingly, among the heat treatment process of the thin film transistor Q, in the process in which the diffusion of the hydrogen ions are formed from each of the source electrode 133 and the drain electrode 135 to the channel part 134, the hydrogen ion deviation between the source electrode 133 and the drain electrode 135 in contact with the channel part 134 and the second region 142b of the insulating layer 142 may be formed within about 10%. Thus, the hydrogen ion diffusion into the channel part 134 may be substantially uniform.

The hydrogen content W1 of the source electrode 133 and the drain electrode 135 may be larger than the third hydrogen content W3 as the hydrogen content of the second region 142b may be in the range of less than about 10%. The hydrogen content W3 of the second region 142b may be larger than the hydrogen content W4 of the first region 142a. The hydrogen content W3 of the second region 142b may be smaller than the hydrogen content W1 of each of the source electrode 133 and the drain electrode 135.

In contrast, the hydrogen content W1 of each of the source electrode 133 and the drain electrode 135 may be smaller than the third hydrogen content W3 as the hydrogen content of the second region 142b is in the range of less than about 10%. The hydrogen content W1 of each of the source electrode 133 and the drain electrode 135 may be larger than the hydrogen content W2 of the channel part 134. The hydrogen content W1 of each of the source electrode 133 and the drain electrode 135 may be smaller than the hydrogen content W3 of the second region 142b.

Referring to FIG. 2 and FIG. 3, a passivation layer 160 may be disposed on the gate electrode 154, the source electrode 133, the drain electrode 135, and the buffer layer 121 and 122. The passivation layer 160 may include the inorganic insulating material or the organic insulating material. The organic insulating material may include silicon nitride or a silicon oxide. The passivation layer 160 may include a first contact hole and a second contact hole. The first contact hole may expose the source electrode 133. The second contact hole may expose the drain electrode 135.

A method of manufacturing the thin film transistor array panel illustrated in FIG. 1 according to an exemplary embodiment of the present invention will be described in more detail with reference to FIG. 1 to FIG. 16.

FIG. 6 to FIG. 9 are cross-sectional views sequentially illustrating a method of manufacturing a thin film transistor array panel of FIG. 1 according to an exemplary embodiment of the present invention.

Figure 6:
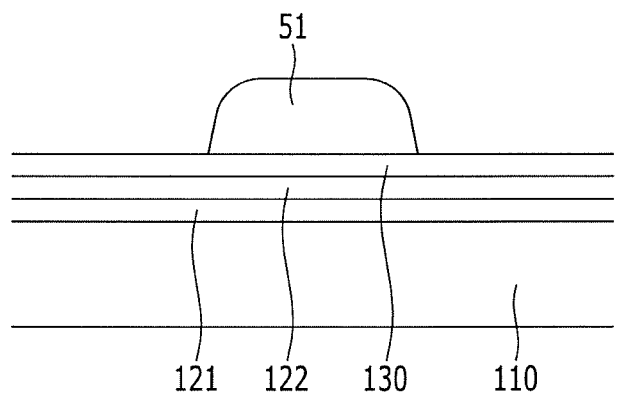
FIG. 6 to FIG. 9 are views illustrating a method for manufacturing a thin film transistor array panel of FIG. 1 according to an exemplary embodiment of the present invention.

Referring to FIG. 6, the first buffer layer 121 and the second buffer layer 122 may be disposed on the insulation substrate 110. The insulation substrate 110 may include glass or plastic.

The first buffer layer 121 may include silicon nitride ($SiN_x$). The second buffer layer 122 may include silicon oxide ($SiO_x$).

A semiconductor layer 130 may be disposed on the second buffer layer 122. The semiconductor layer 130 may include the oxide semiconductor material such as zinc oxide (ZnO), zinc-tin oxide (ZTO), zinc-indium oxide (ZIO), indium oxide (InO), titanium oxide (TiO), indium-gallium-zinc oxide (IGZO), or indium-zinc-tin oxide (IZTO).

A photosensitive film may be coated and exposed on the semiconductor layer 130. The photosensitive film may form a first photosensitive film pattern 51.

The semiconductor layer 130 may be etched by using the first photosensitive film pattern 51 as a mask to form a semiconductor pattern 132. The second buffer layer 122 may also be etched with the semiconductor pattern 132.

Figure 7:
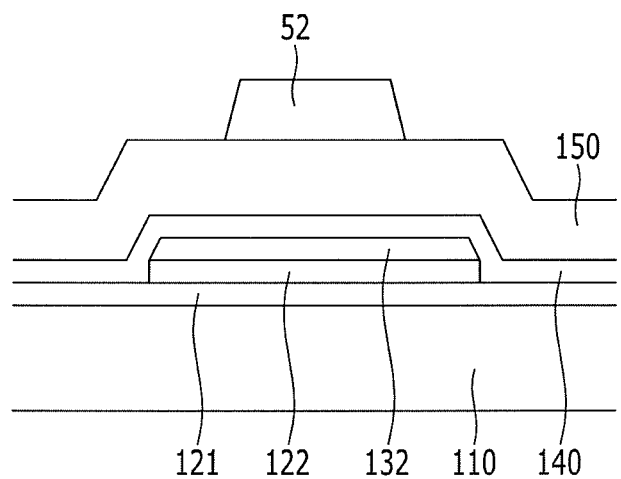

Referring to FIG. 7, an insulating material layer 140 may be formed on the semiconductor pattern 132 and the buffer layer 121 and 122. The insulating material layer 140 may have a single layered structure. The single layered structure may include the insulating oxide such as a silicon oxide ($SiO_x$). Alternatively, the insulating material layer 140 may have a multi-layered structure. The multi-layered structure may include the lower layer including the insulating oxide such as a silicon oxide ($SiO_x$) and the upper layer including the insulating material. The thickness of the insulating material layer 140 may be about 1000 Å to about 5,000 Å; however, exemplary embodiments of the present invention are not limited thereto.

The conductive material such as the metal may be deposited on the insulating material layer 140, for example, to form a gate layer 150. A photosensitive film may be coated and exposed on the gate layer 150, for example, to form a second photosensitive film pattern 52. The second photosensitive film pattern 52 may overlap a part of the semiconductor pattern 132.

Figure 8:
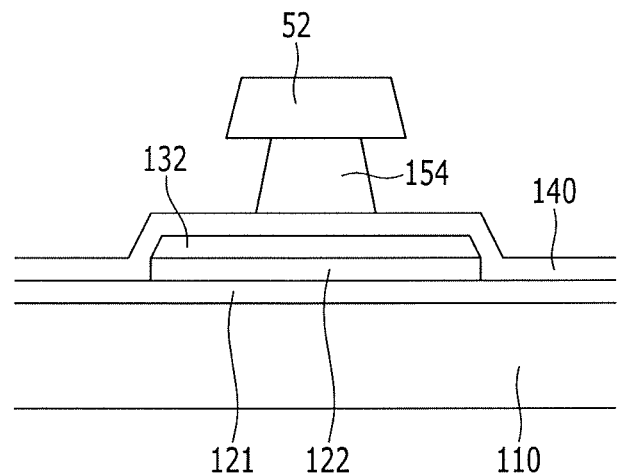

Referring to FIG. 8, the gate layer 150 may be etched by using the second photosensitive film pattern 52 as a mask to form a gate electrode 154. A wet etching method may be used. An etching degree may be controlled for the edge boundary of the gate electrode 154 to be positioned inside the edge boundary of the second photosensitive film pattern 52.

The gate electrode 154 may be formed to pass across the center part of the semiconductor pattern 132. Two parts of the semiconductor pattern 132 may be positioned at respective sides of the overlapping part of the gate electrode 154 and for the semiconductor pattern 132 to not be covered by the gate electrode 154.

Figure 9:
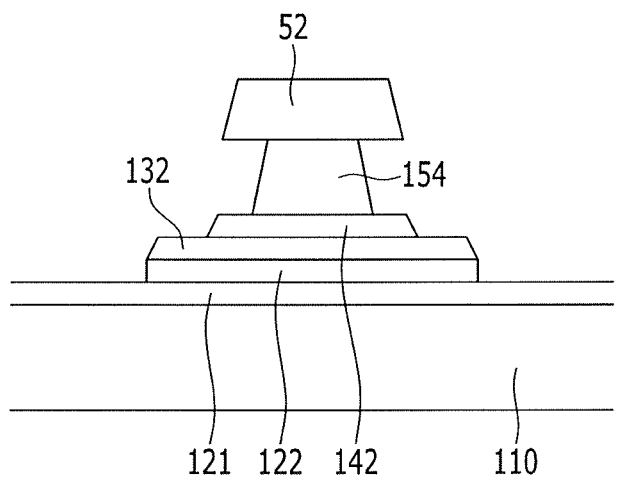

Referring to FIG. 9, the insulating material layer 140 may be patterned by using the second photosensitive film pattern 52 as a mask to form an insulating layer 142. A dry etching method may be used. The edge boundary of the insulating layer 142 may be formed outside the edge boundary of the gate electrode 154. An etching gas and an etching time may be controlled to omit etching the first buffer layer 121.

Two portions of the semiconductor pattern 132 that are not covered by the insulating layer 142 may be positioned at respective sides of the overlapping part of the insulating layer 142 and the semiconductor pattern 132.

The second photosensitive film pattern 51 may be removed. Before removing the second photosensitive film pattern 51, an ashing process using oxygen gas may be performed.

The exposed portion of the semiconductor pattern 132 may be treated to have conductivity to form each of a conductive source electrode 133 and a conductive drain electrode 135. The semiconductor pattern 132 overlapping the gate electrode 154 may become the channel part 134. For example, the conductive treatment may be a reduction treatment.

The reduction treatment of the exposed semiconductor pattern 132 may use a heat treatment method in a reduction atmosphere. Alternatively, the reduction treatment of the exposed semiconductor pattern 132 may use a plasma treatment using a gas plasma such as hydrogen ($H_2$), helium (He), phosphine ($PH_3$), ammonia ($NH_3$), silane ($SiH_4$), methane ($CH_4$), acetylene ($C_2H_2$), diborane ($B_2H_6$), carbon dioxide ($CO_2$), germane ($GeH_4$), hydrogen selenide ($H_2Se$), hydrogen sulfide ($H_2S$), argon (Ar), nitrogen ($N_2$), nitrous oxide ($N_2O$), or a fluorine-based gas (e.g., $F_2$, $NF_3$, $CF_4$, $SF_6$, or $CHF_3$).

At least part of the semiconductor material configuring the exposed semiconductor pattern 132 that is subjected by the reduction treatment may be reduced such that the metal bond remains. Accordingly, the reduced semiconductor pattern 132 may have conductivity, thereby forming each of the source electrode 133 and the drain electrode 135.

A passivation layer 160 may be formed on the gate electrode 154, the source electrode 133, the drain electrode 135, and the first buffer layer 121.

In the process of forming the insulating layer 142, by adjusting at least one among deposition time, deposition temperature, and deposition application power of the insulating layer 142, the hydrogen content deviation of the second region 142b of each of the insulating layer 142, and the source electrode 133 or the drain electrode 135, may be less than about 10%.

Further, in the process of forming the passivation layer 160 covering the gate electrode 154, the source electrode 133, the drain electrode 135, and the first buffer layer 121, by adjusting at least one among the deposition time, the deposition temperature, and the deposition application power of the passivation layer 160, the hydrogen content deviation of each of the second region 142b of the insulating layer 142, and the source electrode 133 or the drain electrode 135, may be less than about 10%.

According to an exemplary embodiment of the present invention, by minimizing the deviation between the hydrogen content of the insulating layer 142 and the hydrogen content of each of the source electrode 133 or the drain electrode 135, the deterioration of the semiconductor characteristics due to the non-uniform diffusion of the hydrogen ions may be reduced or eliminated.

Figure 10:
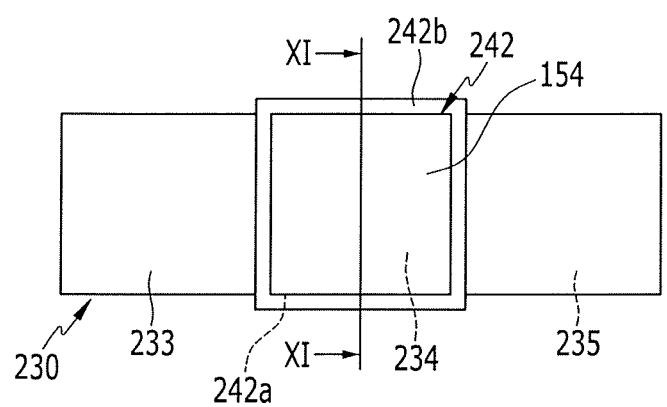
FIG. 10 is a top plan view illustrating a thin film transistor array panel including a thin film transistor according to an exemplary embodiment of the present invention.
Figure 11:
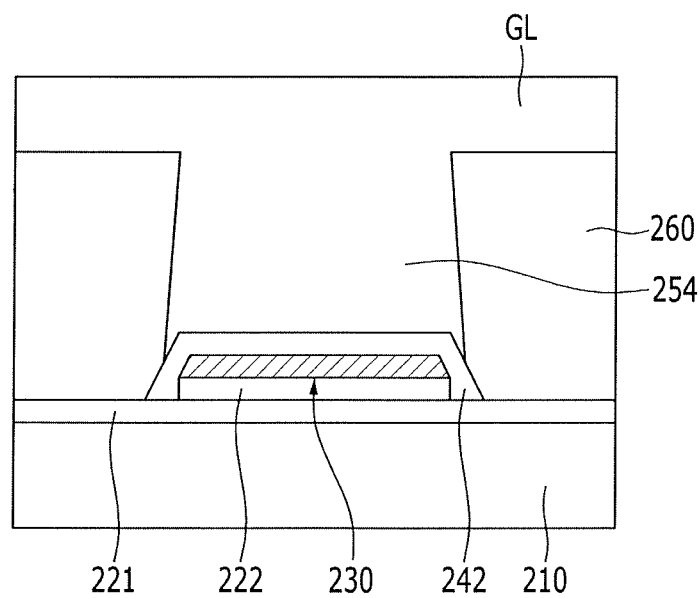
FIG. 11 is a cross-sectional view taken along a line XI-XI of FIG. 10 according to an exemplary embodiment of the present invention.

FIG. 10 is a top plan view illustrating a thin film transistor array panel including a thin film transistor according to an exemplary embodiment of the present invention. FIG. 11 is a cross-sectional view taken along a line XI-XI of FIG. 10 according to an exemplary embodiment of the present invention.

The exemplary embodiment of the present invention illustrated in FIG. 10 and FIG. 11 is substantially similar as the configuration of the thin film transistor of FIG. 1 to FIG. 9. Thus, redundant descriptions may be omitted. The gate electrode and the insulating layer with different configurations will be described in more detail below with reference to FIG. 10 and FIG. 11.

Referring to FIG. 10 and FIG. 11, the thin film transistor array panel may include an insulation substrate 210, a first buffer layer 221, a second buffer layer 222, a semiconductor layer 230, an insulating layer 242, a gate electrode 254, a passivation layer 260, and a gate line GL.

An extending length of each of the insulating layer 242 and the gate electrode 254 of the thin film transistor Q in the second direction may be smaller than an extending length of the semiconductor layer 230 in the first direction.

A length of each of the insulating layer 242 and the gate electrode 254 in the second direction may be smaller than a sum of lengths of a source electrode 233, a channel part 234, and a drain electrode 235 of the semiconductor layer 230. A size of a second region 242b of the insulating layer 242 may be smaller than a size of each of the source electrode 233 and the drain electrode 235 of the semiconductor layer 230.

The gate electrode 254 may have a column shape. The gate electrode 254 may have one end with a shape facing the channel part 234 in contact with a first region 242a of the insulating layer 242. The other end of the gate electrode 254 may be in contact with a gate line GL formed on the passivation layer 260.

The gate electrode 254 and the insulating layer 242 may be formed as an island-like electrode and insulating layer, respectively.

According to an exemplary embodiment of the present invention, as a size of the second region 242b of the insulating layer 242 is minimized, the non-uniform diffusion of the hydrogen ions may be reduced or eliminated.

Figure 12:
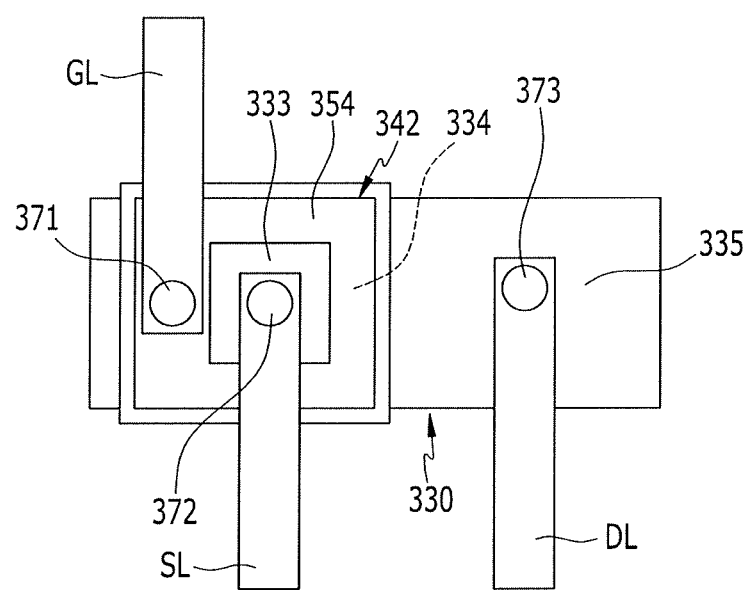
FIG. 12 is a top plan view illustrating a thin film transistor array panel including a thin film transistor according to an exemplary embodiment of the present invention.

FIG. 12 is a top plan view illustrating a thin film transistor array panel including a thin film transistor according to an exemplary embodiment of the present invention.

The exemplary embodiment of the present invention illustrated in FIG. 12 is substantially the same as the configuration of the thin film transistor of FIG. 1 to FIG. 9 for elements other than the semiconductor layer, the gate electrode, and the insulating layer.

Referring to FIG. 12, the thin film transistor array panel may include a source electrode 333, a channel part 334, and a drain electrode 335 each formed in a semiconductor layer 330.

The channel part 334 may have a shape enclosing the source electrode 333. For example, the channel part 334 may have a circular shape or a quadrangular shape of which an inside is opened in a plan view. Further, the channel part 334 may be a circular column or a quadrangular column.

The drain electrode 335 may be disposed on an outer side of the channel part 334. An insulating layer 342 and a gate electrode 354 may each be formed on the channel part 334.

The insulating layer 342 and the gate electrode 354 with the shape corresponding to the channel part 334 may be formed of the circular shape or the quadrangular column shape of which the inside is opened in a view on a plane.

The gate electrode 354 may be connected to the gate line GL through a first contact hole 371 passing through a passivation layer covering each of the gate electrode 154, the source electrode 133, and the drain electrode 135.

Similar to the gate electrode 354, the source electrode 333 and the drain electrode 335 may be connected to a source line SL and a drain line DL through a second contact hole 372 and a third contact hole 373 passing through the passivation layer, respectively.

According to an exemplary embodiment of the present invention, the channel part 334 may be formed with the shape enclosing the source electrode 333; however the channel part 334 may enclose the drain electrode 335 and the source electrode 333 may be provided on the outer part of the channel part 334.

While exemplary embodiments of the present invention has been described herein, it is to be understood that the invention is not limited to the disclosed exemplary embodiments, but, on the contrary, is intended to cover various modifications and equivalent arrangements included within the spirit and scope of the present invention.

What is claimed is:

1. A thin film transistor, comprising:
a semiconductor layer including a source electrode, a drain electrode, and a channel part disposed between the source electrode and the drain electrode;
a gate electrode disposed on the channel part and extending in a direction crossing a channel length direction of the semiconductor layer; and
an insulating layer including a first region disposed between the gate electrode and the channel part and a second region connected to the first region and extending in a same direction as an extending direction of the gate electrode from the first region,
wherein a hydrogen content of the source electrode or the drain electrode is in a range between a maximum hydrogen content that is larger than a hydrogen content of the second region of the insulating layer by about 10% and a minimum hydrogen content that is smaller than the hydrogen content of the second region of the insulating layer by about 10%.

2. The thin film transistor of claim 1, wherein
the hydrogen content of each of the source electrode and the drain electrode is larger than the hydrogen content of the channel part and is smaller than the hydrogen content of the second region of the insulating layer.

3. The thin film transistor of claim 1, wherein
the hydrogen content of the second region of the insulating layer is larger than a hydrogen content of the first region of the insulating layer and is smaller than the hydrogen content of the source electrode or the drain electrode.

4. The thin film transistor of claim 1, wherein
an extending length of the insulating layer and the gate electrode is smaller than an extending length of the semiconductor layer.

5. The thin film transistor of claim 4, wherein
a first end of the gate electrode is in contact with the first region of the insulating layer, and
a gate line is connected to a second end of the gate electrode.

6. The thin film transistor of claim 1, wherein
the channel part encloses the source electrode or the drain electrode.

7. The thin film transistor of claim 6, wherein
the channel part has a circular shape or a quadrangular shape.

8. A thin film transistor array panel, comprising:
an insulation substrate;
a semiconductor layer disposed on the insulation substrate and including a source electrode, a drain electrode, and a channel part disposed between the source electrode and the drain electrode;
a gate electrode disposed on the channel part and extending in a direction crossing a channel length direction of the semiconductor layer; and
an insulating layer including a first region disposed between the gate electrode and the channel part and a second region connected to the first region and extending in a same direction as an extending direction of the gate electrode from the first region,
wherein a hydrogen content deviation of the source electrode or the drain electrode and the second region of the insulating layer is less than about 10%.

9. The thin film transistor array panel of claim 8, wherein
the hydrogen content of each of the source electrode and the drain electrode is larger than a hydrogen content of the channel part and is smaller than the hydrogen content of the second region of the insulating layer.

10. The thin film transistor array panel of claim 8, wherein
the hydrogen content of the second region of the insulating layer is larger than a hydrogen content of the first region of the insulating layer and is smaller than the hydrogen content of the source electrode or the drain electrode.

11. The thin film transistor array panel of claim 8, wherein
an extending length of the insulating layer and the gate electrode is smaller than an extending length of the semiconductor layer.

12. The thin film transistor array panel of claim 11, wherein
a first end of the gate electrode is in contact with the first region of the insulating layer, and
a gate line is connected to a second end of the gate electrode.

13. The thin film transistor array panel of claim 8, wherein
the channel part encloses the source electrode or the drain electrode.

14. The thin film transistor array panel of claim 8, further comprising
a buffer layer disposed between the insulation substrate and the semiconductor layer.

15. A method of manufacturing a thin film transistor array panel, comprising:
forming a semiconductor pattern including an oxide semiconductor material;
forming an insulating layer on a channel part of the semiconductor pattern;
forming a gate electrode on the insulating layer; and
forming a source electrode and a drain electrode on opposite sides of the channel part in the semiconductor pattern,
wherein the insulating layer includes a first region disposed between the gate electrode and the channel part and a second region connected to the first region and extending in a same direction as an extending direction of the gate electrode from the first region,
the gate electrode extends in a direction crossing a channel length direction of the semiconductor pattern, and
a hydrogen content of the source electrode or the drain electrode is in a range between a maximum hydrogen content that is larger than a hydrogen content of the second region of the insulating layer by about 10% and a minimum hydrogen content that is smaller than the hydrogen content of the second region of the insulating layer by about 10%.

16. The method of claim 15, wherein
forming the insulating layer comprises adjusting at least one among a deposition time, a deposition temperature, or a deposition application power of the insulating layer so that the hydrogen content of the source electrode or the drain electrode is in the range between the maximum hydrogen content and the minimum hydrogen content.

17. The method of claim 15, further comprising
forming a passivation layer covering each of the semiconductor pattern, the insulating layer, and the gate electrode.

18. The method of claim 15, wherein
forming the gate electrode on the insulating layer includes forming an extending length of the gate electrode to be smaller than an extending length of the semiconductor pattern, and one end of the gate electrode is in contact with the first region of the insulating layer in a shape facing the channel part, and
a gate line connected to the other end of the gate electrode is formed.

19. The method of claim 15, wherein
forming the gate electrode on the insulating layer includes
forming the gate electrode of a shape corresponding to the channel part on the channel part enclosing the source electrode or the drain electrode.

20. The method claim 17, wherein
at least one among a deposition time, a deposition temperature, or a deposition application power of the passivation layer is adjusted so that the hydrogen content of the source electrode or the drain electrode is in the range between the maximum hydrogen content and the minimum hydrogen content.

21. The method of claim 15, wherein
the channel part of the semiconductor pattern has a circular shape or a quadrangular shape.

* * * * *